United States Patent
Martin

[11] Patent Number: 5,424,916
[45] Date of Patent: Jun. 13, 1995

[54] COMBINATION CONDUCTIVE AND CONVECTIVE HEATSINK

[75] Inventor: Jacob Martin, Wellesley, Mass.

[73] Assignee: The Charles Stark Draper Laboratory, Inc., Cambridge, Mass.

[21] Appl. No.: 386,257

[22] Filed: Jul. 28, 1989

[51] Int. Cl.6 .............................................. H05K 7/20
[52] U.S. Cl. .................... 361/698; 165/80.4; 174/15.2; 361/796
[58] Field of Search ............... 361/382, 385, 386, 388, 361/415, 689, 692, 698, 699, 700, 701, 702, 796; 62/259.2; 165/80.4, 185, 104.33; 174/15.2; 428/614, 901; 211/41; 24/524–526; 257/712, 714, 727

[56] References Cited

U.S. PATENT DOCUMENTS

| | | | |
|---|---|---|---|
| 4,442,475 | 4/1984 | Franklin | 361/383 |
| 4,829,402 | 5/1989 | Gewebler | 361/383 |
| 4,878,158 | 10/1989 | Sauzade | 361/386 |
| 4,931,905 | 6/1990 | Cirrito | 361/700 |
| 4,958,257 | 9/1990 | Wenke | 361/385 |
| 5,077,637 | 12/1991 | Martorana | 361/386 |
| 5,131,456 | 7/1992 | Wu | 361/700 |
| 5,224,017 | 6/1993 | Martin | 361/388 |
| 5,224,030 | 6/1993 | Banks | 361/386 |

*Primary Examiner*—Gerald P. Tolin
*Attorney, Agent, or Firm*—Iandiorio & Teska

[57] ABSTRACT

A combination conductive and convective heatsink for use in an electronic module including a heatsink member having first and second major planar surfaces; each surface adapted for thermally engaging with an adjacent electronic circuit element. The heatsink member also includes a plurality of flow-through channels disposed between the first and second major planar surfaces. The flow-through channels engage with flow-through passages in an electronic module mounting rack, for allowing the flow of a fluid medium through the passages and the channels for convectively cooling the electronic module. The heatsink also includes a plurality of thermally conductive members disposed between the first and second major planar surfaces of the heatsink member, for thermally conductively engaging the heatsink member with the electronic module mounting rack for conducting heat from the electronic module to the mounting rack.

17 Claims, 4 Drawing Sheets

COMBINATION CONDUCTIVE AND CONVECTIVE HEATSINK

FIELD OF INVENTION

This invention relates to a multimode heatsink for an electronic module which mounts within an electronic module mounting rack, and more particularly to such a heatsink which can be cooled by conduction or convection.

BACKGROUND OF INVENTION

When electronic module power consumptions were lower, it was not necessary to make special provisions for removing heat from the circuit boards of the electronic modules to the box structure or mounting rack in which they were contained. As electronic module power consumption has increased, however, heatsinks and other thermally conductive structures were added to the module to conduct heat from the module to the walls of the mounting rack. It is now also common to have air cooling built into the side walls of the mounting rack. Electronic module power levels have now risen so high that liquid cooling or other more efficient heat transfer methods must be developed.

There are several approaches for continuing the use of air for cooling high power modules. One approach involves supplying cooling air at much lower temperatures and increasing the supply of the cooling air. This solution is expensive and can cause condensation of moisture on the air ducts if the air temperature is below the ambient dew point.

A second approach involves blowing cooling air directly over the surface of the electronic components on the module. This solution, however, is undesirable in some applications because of the chance that the cooling air might be carrying undesirable contaminants or moisture.

A third approach is to make the module heatsinks hollow and run the cooling air directly through the heatsink. Since conductive heat transfer resistances are minimized with this method, the cooling air does not have to be so cold.

Newer high-power density modules are being designed to operate within a safe temperature range by providing conductive heatsinks which conduct the heat to much colder liquid-cooled walls of the mounting rack. In retrofit situations, however, it is desired to replace older, low-power density modules with the newer, high-power density modules. In this retrofit situation, special provisions for cooling must be made. If cooling air is already available, the air must either flow through the module or the cooling system must be replaced to provide much cooler air or liquid flowing through the walls of the mounting rack. Further, a high power electronic module with a hollow core heatsink designed for flow-through air cooling may operate at excessive temperatures in a conductively cooled box if there is not enough conductive material in the flow-through heatsink to efficiently conduct the heat to the side walls of the module rack.

SUMMARY OF INVENTION

It is therefore an object of this invention to provide a more universal heatsink for electronic modules.

It is a further object of this invention to provide a multimode heatsink which may be used in circuit mounting racks having varying cooling modes.

It is a further object of this invention to provide such a multimode heatsink which is a combination conductive and convective heatsink.

It is a further object of this invention to provide such a multimode heatsink which is lightweight.

It is a still further object of this invention to provide such a multimode heatsink which has a high thermal conductivity-to-weight ratio.

It is a still further object of this invention to provide such a heatsink which closely matches the coefficient of thermal expansion of the electronic circuit or package mounted to it.

It is yet a further object of this invention to provide a multimode heatsink which allows new high-power density electronic modules to be used with older air-cooling systems.

It is a still further object of this invention to provide such a multimode heatsink which provides adequate electronic module cooling in the event that the convective cooling mode becomes inoperative or inefficient.

This invention results from the realization that a truly novel and more universal heatsink may be accomplished by providing within the same heatsink a plurality of conductive heat pipes or other high thermal conductivity members along with a convective flow-through heat exchanger to create a combination conductive and convective heatsink.

This invention features a combination conductive and convective heatsink for use in a heat-generating electronic module and comprises a heatsink member including first and second major planar surfaces; each surface is adapted for thermally engaging with an adjacent electronic circuit element. A plurality of flow-through channels are disposed between the first and second major planar surfaces and are adapted for engaging with flow-through passages in an electronic module mounting rack, for allowing the flow of a fluid medium through the passages and channels. Further, a plurality of thermally conductive members are also disposed between the first and second major planar surfaces of the heatsink member, and are adapted for thermally conductively engaging the heatsink member with the electronic module mounting rack for conducting heat from the electronic module to the mounting rack.

In a preferred embodiment, the thermally conductive members may be heat pipes, or alternatively, may include a plurality of carbon fibers.

The combination conductive and flow-through heatsink may further include at least one electronic circuit element mounted proximate the heatsink. The electronic circuit element has a predetermined coefficient of thermal expansion. The heatsink member may include a composite of first and second materials, the first material having a first coefficient of thermal expansion, and the second material having a second coefficient of thermal expansion. The first and second materials are combined in a quantity ratio to produce a composite heatsink member with a combined coefficient of thermal expansion which closely matches the predetermined coefficient of thermal expansion of the electronic circuit element. The first material may have a positive coefficient of thermal expansion and the second material may have a negative coefficient of thermal expansion. The heatsink may further include clamping means for thermally engaging the heatsink member and electronic module with the electronic module mounting rack.

This invention also features an electronic module for mounting with a mother board within an electronic module mounting rack. The electronic module includes at least one electronic circuit element having a predetermined coefficient of thermal expansion. The heatsink member is mounted adjacent the electronic circuit element and is formed from a composite of first and second materials, the first material having a first coefficient of thermal expansion and the second material having a second coefficient of thermal expansion. The first and second materials are combined in a quantity ratio to produce a composite heatsink member with a combined coefficient of thermal expansion which closely matches the coefficient of thermal expansion of the electronic circuit board. The heatsink member includes a plurality of flow-through channels adapted for engaging flow-through passages in the electronic module mounting rack. In addition, the heatsink member includes a plurality of thermally conductive members, adapted for thermally conductively engaging the electronic module mounting rack. The thermally conductive members of the electronic modules may be heat pipes, or alternatively may include a plurality of carbon fibers. Clamping means may be provided for thermally engaging the electronic module to the electronic module mounting rack. The electronic module may also include means for interconnecting the flow-through channels with the flow-through passages. Also included may be means for electrically interconnecting the electronic module with a mother board located in the electronic module mounting rack. The electronic module may also include two electronic circuit boards mounted adjacent two major planar surfaces of the heatsink. In a preferred embodiment, the flow-through channels alternate in placement with the thermally conductive members within the heatsink member.

DISCLOSURE OF PREFERRED EMBODIMENT

Other objects, features and advantages will occur to those skilled in the art from the following description of a preferred embodiment and the accompanying drawings, in which.

Figure 3:
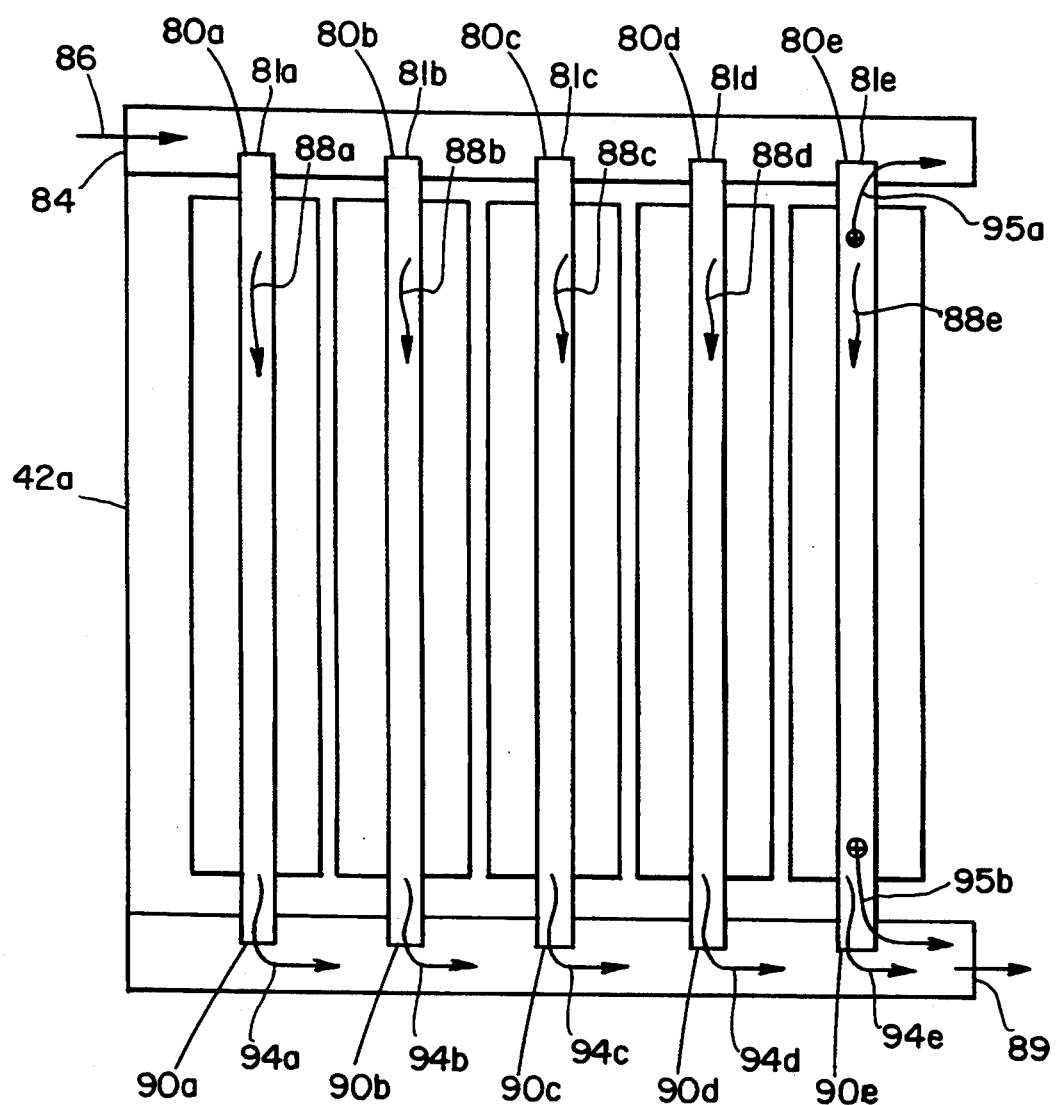
Figure 4:
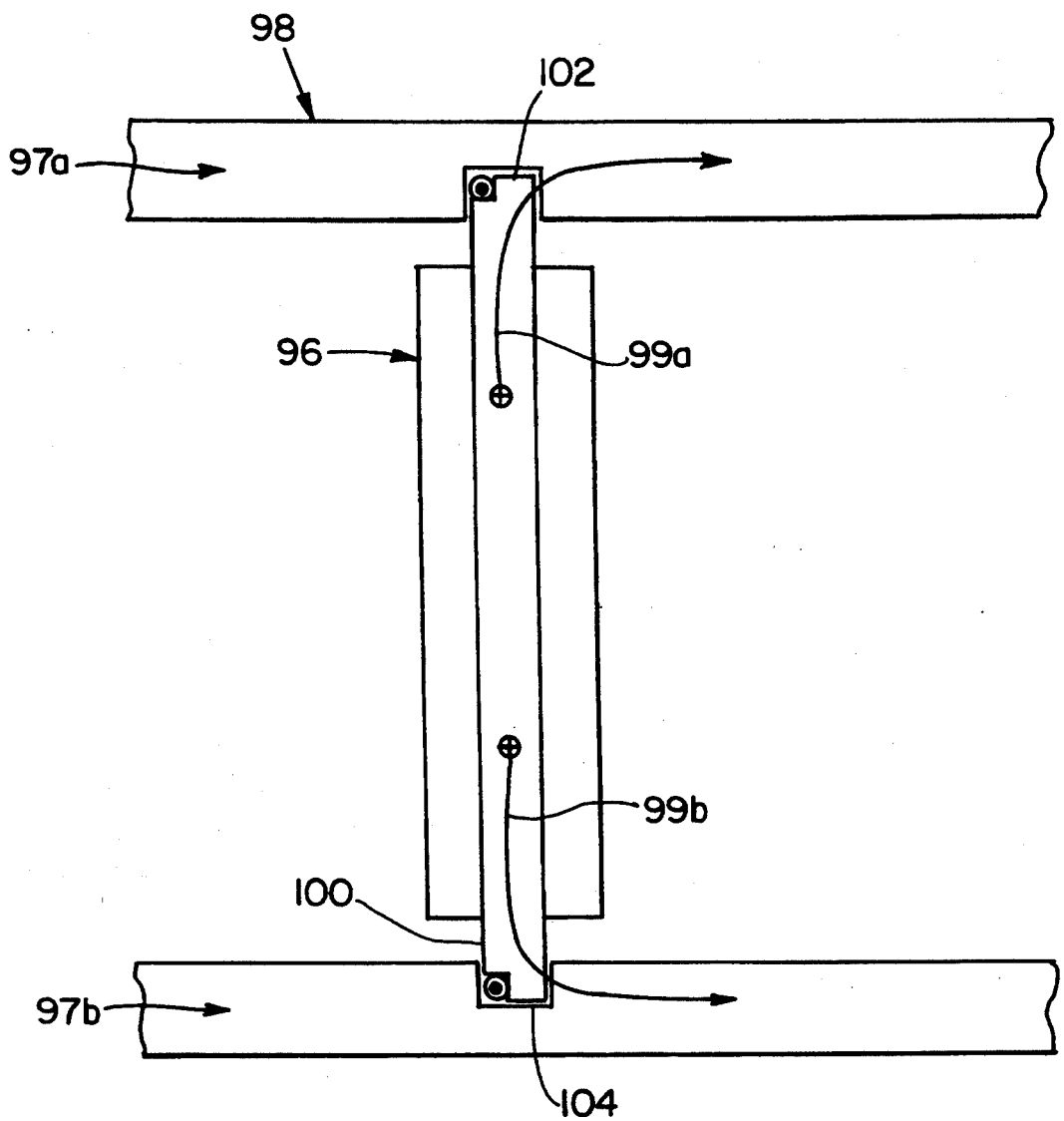

FIG. 3 is a top view of a plurality of electronic modules arranged in an electronic module mounting rack in which the heatsinks incorporate the convective and conductive modes of cooling according to the present invention; and FIG. 4 is a top view of an electronic module mounted in an electronic module mounting rack in which the heatsink incorporates the conductive mode of cooling according to the present invention.

A combination conductive and convective heatsink according to this invention may be accomplished by providing a heatsink member for mounting proximate one or more electronic elements such as a circuit package or circuit board from which heat is to be transferred. The heatsink member and the electronic elements comprise an electronic module which is adapted to mount within an electronic module mounting rack and electrically and possibly optically mate with a mother board, also located within the mounting rack.

The heatsink member includes a plurality of flow-through channels and is adapted for engaging with flow-through passages in the electronic module mounting rack for providing the flow of a fluid medium through the passages and channels of the heatsink member and mounting rack. The fluid medium may be ambient or cooled air, or a liquid coolant and heat transfer fluid such as a mixture of Ethylene glycol and water; Fluorinert by 3M; Coolanol by Monsanto; Multitherm by Multitherm Corp; or Dowtherm by Dow.

The heatsink member also includes a plurality of thermally conductive members alternatingly interposed between the flow-through channels. The thermally conductive members are adapted for thermally engaging the heatsink with the electronic module mounting rack for conducting heat from the electronic module to the mounting rack. In a preferred embodiment, the thermally conductive members may include a conventional heat pipe which operates on the evaporation and condensation of a liquid within a closed tube or pipe. Alternatively, a conductive member may take the form of a plurality of carbon fibers. Although carbon fibers are anisotropic, they are lightweight and have very high conductivities along their longitudinal axis. The fibers may be oriented to engage at one end with the heatsink member proximate the electronic circuit board. The other end of the fiber may engage with the heatsink member adjacent to the electronic module mounting rack, for conducting heat from the electronic circuit board to the electronic module mounting rack.

Although the heatsink member may be made out of aluminum or other metal or metal laminates or composites, a preferred method is to form a composite heatsink from a quantity of first and second materials. The first and second materials have positive and negative coefficients of thermal expansion respectively, and are combined in a quantity ratio such that the resultant coefficient of thermal expansion of the composite heatsink member closely matches the coefficient of thermal expansion of the electronic board or component mounted proximate the heatsink member. Typically, the first material is a metal selected from the group consisting of aluminum, magnesium, titanium or copper. Layered with the first material is a carbon-based material, which has a negative coefficient of thermal expansion. The carbon-based material may be in the form of carbon or graphite powder, diamond dust, or chopped graphite fibers. Alternatively, the composite material may include a second material with a low coefficient of thermal expansion such as silicon carbide and may be combined with aluminum.

Figure 1:
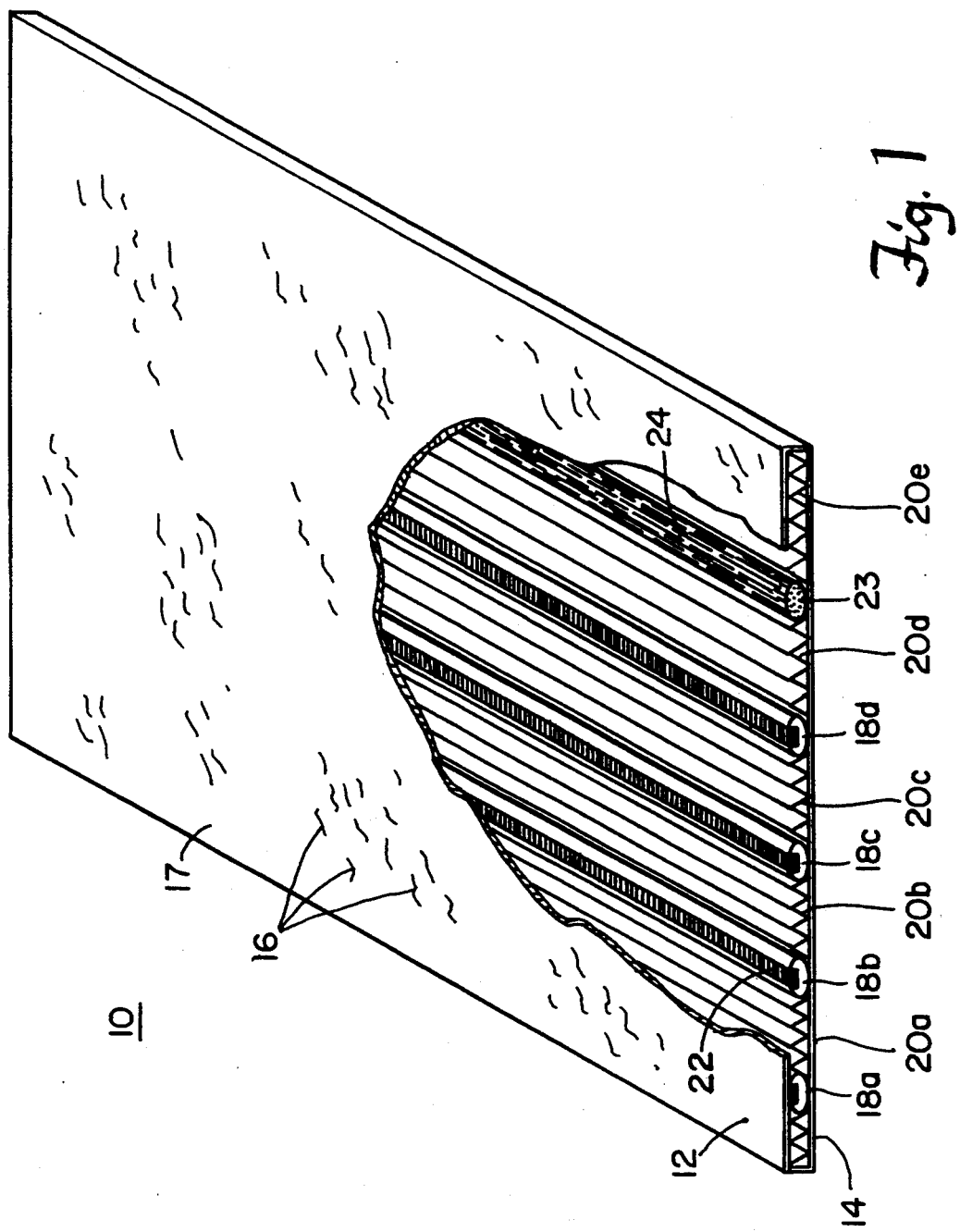
FIG. 1 is a three-dimensional schematic view with portions broken away of the combination conductive and convective heatsink according to the present invention.

There is shown in FIG. 1 combination conductive and flow-through heatsink member 10. Heatsink member 10 includes first and second major planar surfaces 12 and 14, respectively. Adjacent to each planar surface may be located an object from which heat is to be transferred. Such an object is typically an electronic circuit board. Heatsink member 10 may comprise a composite material consisting of a quantity of first metal material 17 having a positive coefficient of thermal expansion, with which is mixed a second carbon-based material such as carbon fibers 16 or other material having a low coefficient of thermal expansion. The resultant composite material has a combined coefficient of thermal expansion which may be tailored to closely match that of the adjacent electronic circuit boards or components. Details of such a composite material may be found in applicant's copending application Ser. No. 07/353,086, now abandoned entitled "Composite Heat Transfer Device" which is incorporated herein by reference.

The combination conductive and flow-through heatsink of this invention is made by alternating the placement of heat pipes 18a–18d and 23, with the placement of flow-through passage areas 20a–20e. Heat pipe 18b, for example, may be a conventional heat pipe including wicking material 22 located on the inner surface of the pipe. Alternatively, solid heat pipe 23 may include a plurality of carbon fibers 24 which are oriented to conduct heat from heat sink member surfaces 12 and 14 to an electronic module mounting rack or other heat dissipative member thermally engaged with the heatsink.

Figure 2:
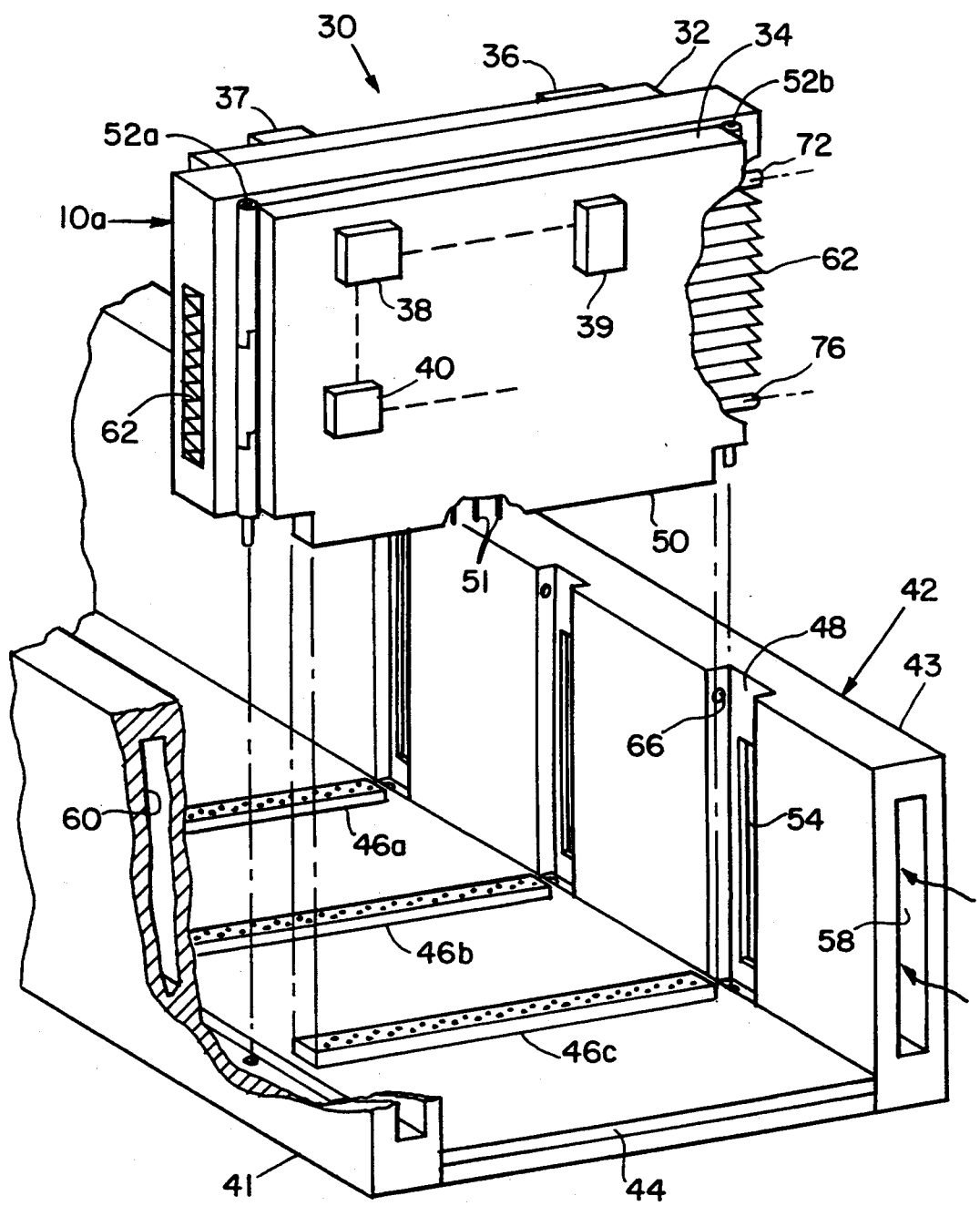
FIG. 2 is an exploded, three-dimensional, diagrammatic view of an electronic module including two electronic circuit boards mounted to the combination conductive and convective heatsink of this invention, prior to insertion of the module into a module mounting rack and mother board.

Combination conductive and convective heatsink 10a, FIG. 2, is adapted for use in electronic module 30. Electronic module 30 includes first and second electronic circuit boards 32 and 34 mounted on either side of combination heatsink member 10a. Electronic circuit boards 32 and 34 may interconnect a number of electronic circuit devices 36–40.

Electronic module 30 is adapted for mounting in electronic module mounting rack 42. Electronic module mounting rack 42 includes side walls 41 and 43 as well as mother board 44 on which are located a plurality of connectors 46a–46c. Connectors 46a–46c electrically connect electronic modules 30 with other modules or external devices. As illustrated, electronic module 30 engages electronic module mounting rack 42 by means of engagement slot or recess 48 located within side wall 43 and a similar recess in side wall 41 not shown. Recess 48 guides electronic module 30 into mounting rack 42 until electronic module connector 50 and connector pins 51 engage and mate with mother board connector 46b. Clamping means such as wedge locks 52a and 52b thermally engage electronic module 30 with electronic module mounting rack 42 within recess 48.

Recess 48 also includes opening 54, which provides access to flow-through passage 58 located in side wall 43 of electronic module mounting rack 42. Opening 54 is adapted to align and interconnect flow-through passages 58 and 60 with flow-through channel 62 of heatsink member 10a for convective cooling, while recess area 66 thermally conductively engages with heat pipes 72 and 76, for conducting heat from electronic module 30 to mounting rack 42.

The advantages of the combination conductive and convective heatsink according to this invention are clearly illustrated in FIG. 3, wherein electronic modules 80a–80e engage with electronic module mounting rack 42a. Cooling medium enters the mounting rack at 84 in the direction of arrow 86 and is directed into the module by plenums 81a–81e. The cooling medium then flows through the electronic modules as illustrated by arrows 88a–88e. The cooling medium exits the electronic modules at 90a–90e in the direction of arrows 94a–94e and subsequently exits the mounting rack at 89. In addition to convective cooling, the conductive mode of cooling may supplement flow-through cooling in situations where the cooling medium may be temporarily inadequate or fails completely. In those cases, the conductive members of the heatsink conduct heat from the module to the walls of the mounting rack as illustrated by arrows 95a and 95b on electronic module 80e.

In many instances, it is desired to utilize these modules in electronic module mounting racks that are not adapted for flow-through heatsink cooling. In those cases, electronic module 96, FIG. 4, may be inserted in such an electronic module mounting rack 98. The heat pipes or other thermally conductive members located within heatsink member 100 thermally engage with recesses 102, 104 of mounting rack 98 and conduct heat from electronic module 96 to the mounting rack as represented by arrows 99a and 99b and the fluid cooling medium, flowing in the direction of arrows 97a, 97b. Thus, the combination conductive and convective heatsink of this invention is adapted for use in either of two separate cooling modes. The two modes may also cooperate with one another to provide more effective cooling when flow through is used. In this case, the high conductivity of the heatsink tends to lower the temperature of the hot portion of the module.

Although specific features of the invention are shown in some drawings and not others, this is for convenience only as each feature may be combined with any or all of the other features in accordance with the invention.

Other embodiments will occur to those skilled in the art and are within the following claims:

What is claimed is:

1. A combination conductive and convective heatsink for use in an electronic module comprising:
   a heatsink member including first and second major planar surfaces, each surface adapted for engaging with an adjacent electronic circuit element;
   a plurality of flow-through channels disposed between said first and second major planar surfaces, and adapted for engaging flow-through passages in an electronic module mounting rack, for allowing the flow of a fluid medium through said passages and channels for convectively cooling said electronic module; and
   a plurality of discrete, thermally conductive members disposed between said first and second major planar surfaces, adapted for thermally conductively engaging said heatsink member with said electronic module mounting rack for conducting heat from said electronic module to said mounting rack;
   wherein at least one of said plurality of said thermally conductive members includes a plurality of carbon fibers.

2. The combination heatsink of claim 1 in which said thermally conductive members are heat pipes.

3. The heatsink of claim 1 in which said heatsink member includes a composite of first and second materials, said first material having a first coefficient of thermal expansion and said second material having a second coefficient of thermal expansion, said first and second materials being combined in a quantity ratio to produce a composite heatsink member with a combined coefficient of thermal expansion which closely matches a predetermined coefficient of thermal expansion of an electronic circuit board mounted on said heat sink member.

4. The heatsink of claim 3 in which said first material has a positive coefficient of thermal expansion, and said second material has a negative coefficient of thermal expansion.

5. The heatsink of claim 1 further including clamping means for thermally engaging said heatsink member and an electronic circuit board mounted thereon to an electronic module mounting rack.

6. A combination conductive and convective heatsink for mounting with a mother board within an electronic module mounting rack comprising;
   at least one electronic circuit element having a predetermined coefficient of thermal expansion;
   a heatsink member mounted and thermally engaged with said electronic circuit element, including a composite of first and second materials, said first material having a first coefficient of thermal expansion and said second material having a second coefficient of thermal expansion, said first and second materials being combined in a quantity ratio to produce a composite heatsink member with a combined coefficient of thermal expansion which closely matches the predetermined coefficient of thermal expansion of said electronic circuit element;
   a plurality of flow-through channels in said heatsink member adapted for engaging flow-through passages in the electronic module mounting rack; and
   a plurality of thermally conductive members in said heatsink member, adapted for conductively engaging said electronic module mounting rack.

7. The combination heatsink of claim 6 in which said thermally conductive members are heat pipes.

8. The combination heatsink of claim 6 in which said thermally conductive members include a plurality of carbon fibers.

9. The combination heatsink of claim 6 further including clamping means for thermally engaging the electronic module with an electronic module mounting rack for enabling heat transfer between the electronic module and the mounting rack.

10. The combination heatsink of claim 6 further including means for interconnecting said flow-through channels with flowthrough passages in an electronic module mounting rack.

11. The combination heatsink of claim 6 further including means for electrically interconnecting an electronic module with a mother board located in an electronic module mounting rack.

12. The combination heatsink of claim 6, in which an electronic module includes two electronic circuit boards, each circuit board in contact with said heatsink member.

13. The combination heatsink of claim 6 in which said flow-through channels alternate in placement with said thermally conductive members in said heatsink member.

14. An electronic module having a combination conductive and convective heatsink for mounting with a mother board within an electronic module mounting rack comprising:
   two electronic circuit boards having a predetermined coefficient of thermal expansion;
   a heatsink mounting and thermally engaging with said electronic circuit boards, including a composite of first and second materials, said first material having a first coefficient of thermal expansion and said second material having a second coefficient of thermal expansion, said first and second materials being combined in a quantity ratio to produce a composite heatsink with a combined coefficient of thermal expansion which closely matches the predetermined coefficient of thermal expansion of said electronic circuit boards;
   a plurality of flow-through channels in said heatsink for engaging flow-through passages in the electronic module mounting rack; and
   a plurality of heat pipes in said heatsink alternating in placement with said flow-through channels and adapted for conductively engaging said electronic module mounting rack for conveying heat from said circuit boards to said mounting rack.

15. The electronic module of claim 14 further including clamping means for thermally engaging the electronic module with the electronic module mounting rack for enabling heat transfer between the electronic module and the mounting rack.

16. The electronic module of claim 14 further including means for interconnecting said flow-through channels with said flow-through passages.

17. The electronic module of claim 14 further including means for electrically interconnecting the electronic module with a mother board located in an electronic module mounting rack.

* * * * *